United States Patent
Seo

(10) Patent No.: US 7,112,530 B2
(45) Date of Patent: Sep. 26, 2006

(54) METHOD OF FORMING CONTACT HOLE

(75) Inventor: Byoung Yoon Seo, Yeoju-gun (KR)

(73) Assignee: Dongu Electronics Co., Ltd., Seoul (KR)

( * ) Notice: Subject to any disclaimer, the term of this patent is extended or adjusted under 35 U.S.C. 154(b) by 0 days.

(21) Appl. No.: 11/024,662

(22) Filed: Dec. 30, 2004

(65) Prior Publication Data

US 2006/0042653 A1   Mar. 2, 2006

(30) Foreign Application Priority Data

Sep. 1, 2004   (KR) .................. 10-2004-0069511

(51) Int. Cl.
*H01L 21/461* (2006.01)

(52) U.S. Cl. .................. 438/689; 216/96; 216/103; 134/1.3; 252/79.1; 438/624; 438/637; 438/651; 438/700; 438/724

(58) Field of Classification Search .................. 216/96, 216/103; 134/1.3; 252/79.1; 438/624, 637
See application file for complete search history.

(56) References Cited

U.S. PATENT DOCUMENTS 6,838,330 B1 *  1/2005  Moon et al. ............... 438/230

OTHER PUBLICATIONS

W.Kern, Handbook of Semiconductor Wafer Cleaning Technology, Noyes Publications, (1993), pp. 127-128.*

* cited by examiner

*Primary Examiner*—Nadine G. Norton
*Assistant Examiner*—Maki Angadi
(74) *Attorney, Agent, or Firm*—Oblon, Spivak, McClelland, Maier & Neustadt, P.C.

(57) ABSTRACT

A method of forming a contact hole in a semiconductor device, by which a PMD layer as an insulating interlayer is prevented from being overetched by wet cleaning for removing polymer and photoresist after forming a contact hole perforating the PMD layer in a manner of adjusting temperature and concentration of an NC-2 solution for the wet cleaning. The present invention includes the steps of forming a premetal dielectric layer on a semiconductor substrate, forming a contact hole perforating the premetal dielectric layer, and cleaning the substrate using an NC-2 cleaning solution at a temperature equal to or lower than about 55° C.

18 Claims, 5 Drawing Sheets

METHOD OF FORMING CONTACT HOLE

BACKGROUND OF THE INVENTION

1. Field of the Invention

The present invention relates to a method of forming a contact hole in a semiconductor device.

2. Discussion of the Related Art

Generally, to keep up with rapid developments in information media such as a computer and the like, semiconductor fabrication methods have been remarkably developed. For semiconductor devices, further enhancement in the degree of integration, nano-sized implementations, operational speeds, and the like, are needed. As known by Moore's Law, the degree of integration of semiconductor devices is biannually raised twice higher. Inevitably, new problems which were never taken into consideration arise due to the reduced chip size and the reduced critical dimension (CD).

Meanwhile, a premetal dielectric (PMD) layer, which is an insulating interlayer for isolating a polysilicon gate from a metal line, needs to be efficient in gap-fill performance, gathering performance, and planarization.

The phrase "gap-fill performance" refers to a capability of filling up a step difference due to a pattern of a semiconductor device. And, the phrase "gathering performance" refers to capability of trapping mobile ions degrading a device characteristic such as natrium ions and other metal ions.

A silicon oxide ($SiO_2$) layer frequently used as an insulating layer is incapable of filling a step difference formed by a polysilicon gate. Since voids are formed in the PMD layer of silicon oxide, the PMD layer fails to be dense or thick to degrade the device characteristic. Moreover, a conductor material is formed in the voids on depositing the conductor material as a contact plug, whereby the PMD layer of silicon oxide lowers a production yield of the semiconductor device.

To overcome such a problem, silicon oxide is replaced by borophosphosilicate glass (BPSG) having excellent gap-fill performance as a PMD layer. A BPSG layer is generally formed in a manner of introducing boron (B) and phosphor (P) into a reaction chamber together with silicon and oxygen source for forming silicon oxide. In doing so, boron is a dopant for improving the gap-fill performance and phosphor is a dopant for improving the gather performance of mobile ions.

FIG. 1 is a cross-sectional diagram of a contact hole in a semiconductor device according to a related art.

Referring to FIG. 1, shallow trench isolation (STI) is carried out on a semiconductor substrate 100 to form a device isolation layer 102. Subsequently, a gate oxide layer 104, a polysilicon gate 106, source/drain (not shown in the drawing), a sidewall nitride layer 108, a silicide layer 110, and the like are formed on the semiconductor substrate 100. And, a PMD liner layer 112, a BPSG layer 114, and an oxide layer 116 are sequentially stacked over the substrate including the silicide layer 110.

Thereafter, contact holes for electric connection to the source/drain are formed on the semiconductor substrate 100 in a following manner. First of all, a dry etch is carried out on the semiconductor substrate 100 to form the contact holes exposing the silicide layer 110 onto the source/drain. After completion of the dry etch, wet cleaning is carried out on the semiconductor substrate 100 to remove polymers generated from the dry etch and photoresist. Specifically, the wet cleaning includes sulfuric hydroxide (SH) cleaning at about 130° C. and new cleaning-2 (NC-2) at about 75° C.

However, in performing the wet cleaning, a portion 120 of the BPSG layer 114 is overetched to degrade device characteristics. And, in forming a contact plug to fill up the contact hole, a metal material of the contact plug intrudes the overetched portion 120 to short-circuit the semiconductor device.

SUMMARY OF THE INVENTION

Accordingly, the present invention is directed to a method of forming a contact hole in a semiconductor device that substantially obviates one or more problems due to limitations and disadvantages of the related art.

The present invention provides a method that prevents a premetal dielectric layer from being overetched in a cleaning process of removing polymer and photoresist after completion of forming a contact hole perforating the premetal dielectric layer as an insulating interlayer.

The present invention advantageously provides a method of forming a contact hole in a semiconductor device, by which a PMD layer as an insulating interlayer is prevented from being overetched by wet cleaning for removing polymer and photoresist after forming a contact hole perforating the PMD layer in a manner of adjusting temperature and concentration of an NC-2 solution for the wet cleaning.

Another object of the present invention is to provide a method of forming a contact hole in a semiconductor device, by which characteristics and yield of the semiconductor device are enhanced.

Additional advantages, objects, and features of the invention will be set forth in part in the description which follows and in part will become apparent to those having ordinary skill in the art upon examination of the following. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a method of forming a contact hole according to the present invention includes the steps of forming a premetal dielectric layer on a semiconductor substrate, forming a contact hole perforating the premetal dielectric layer, and cleaning the substrate using an NC-2 cleaning solution at a temperature equal to or lower than about 55° C.

Preferably, the method further includes the step of forming a premetal dielectric liner layer beneath the premetal dielectric layer.

More preferably, the premetal liner layer is formed of either PETEOS or SiN.

Preferably, the method further includes the step of forming a PETEOS layer on the premetal dielectric layer.

Preferably, the method further includes the step of cleaning the substrate using a SH cleaning solution prior to the NC-2 cleaning solution cleaning step.

Preferably, the premetal dielectric layer is selected from the group consisting of BPSG, BSG, and PSG layers.

Preferably, a volume ratio of the NC-2 cleaning solution is set as $TMH:H_2O_2:H_2O=1:2.3{\sim}10:30{\sim}40$.

Preferably, a semiconductor device including a gate electrode and source/drain is formed on the semiconductor substrate.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

Figure 1:
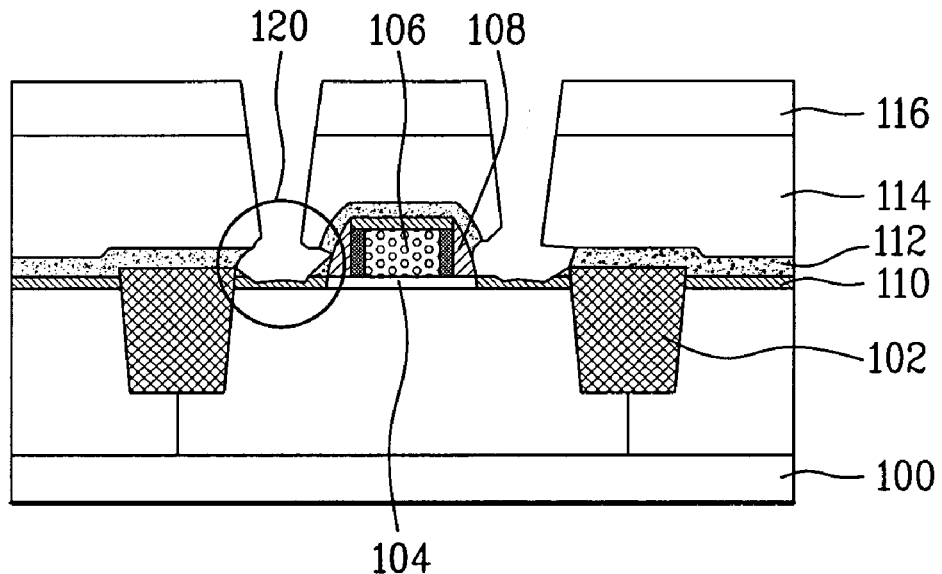
FIG. 1 is a cross-sectional diagram of a contact hole according to a related art.
Figure 2A:
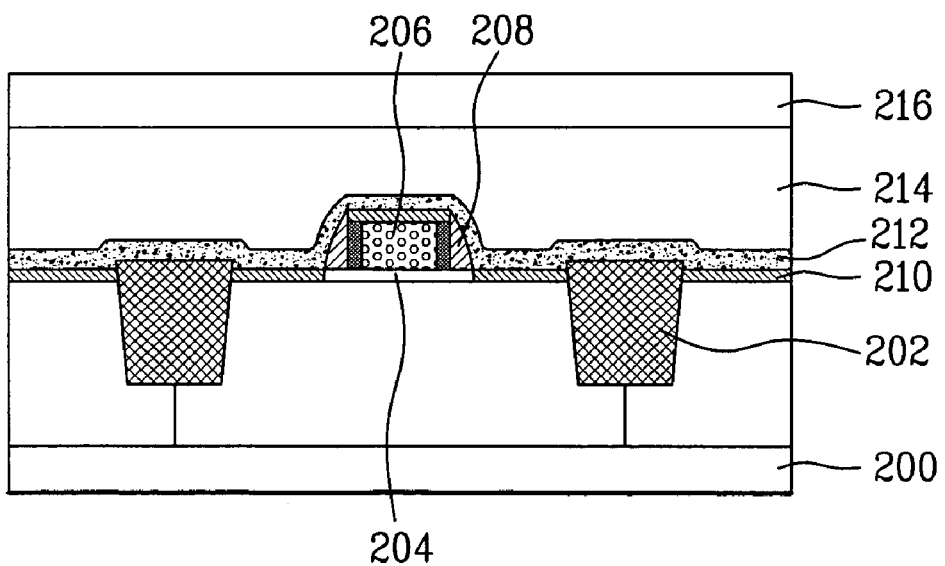
FIGS. 2A to 2C are cross-sectional diagrams of a substrate for explaining a method of forming a contact hole according to the present invention.
Figure 2B:
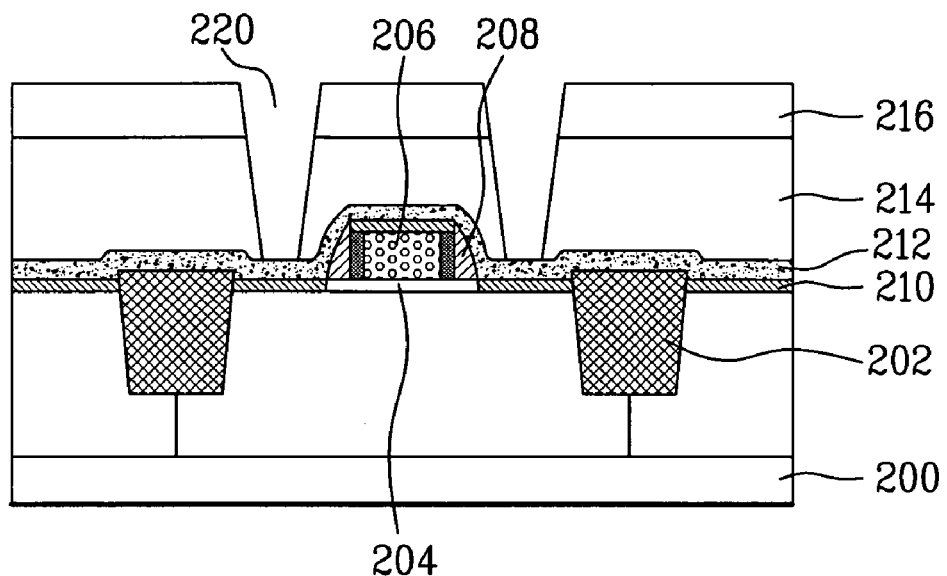
Figure 2C:
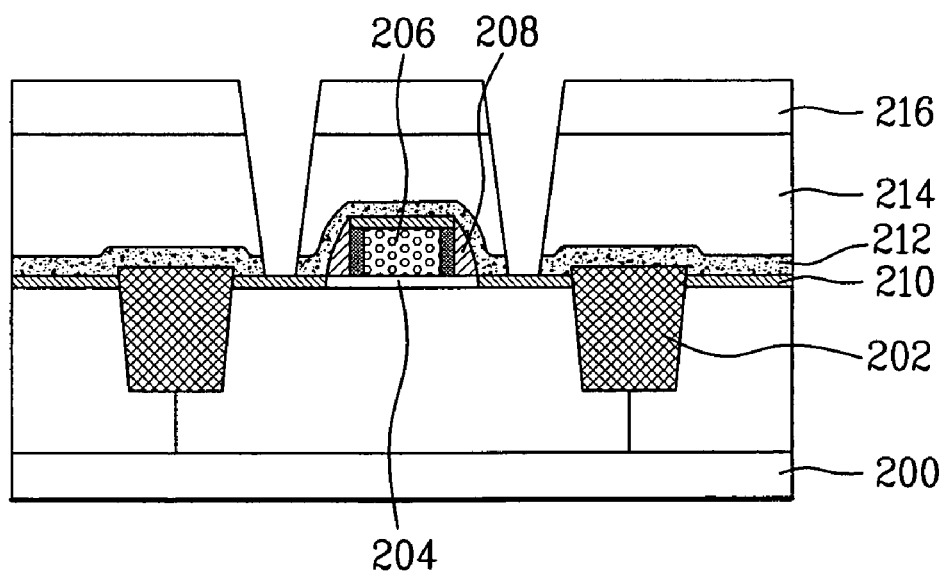

FIGS. 2A to 2C are cross-sectional diagrams of a substrate for explaining a method of forming a contact hole according to the present invention.

Referring to FIG. 2A, a device isolation layer 202 is formed on a semiconductor substrate 200 by STI or local oxidation of silicon (LOCOS).

And, a gate oxide layer 204, a polysilicon gate 206, source/drain (not shown in the drawing), a sidewall nitride layer 208, a silicide layer 210, and the like are formed on the semiconductor substrate 100 to fabricate a semiconductor device. In doing so, the silicide layer 210 is formed of $Ti_2Si_6$ to be contacted with a contact metal for forming a contact plug filling a contact hole that will be formed later, for example.

Subsequently, a PMD liner layer 212 is formed over the semiconductor substrate 200 including the silicide layer 210. Preferably, the PMD liner layer 212 is formed of silicon nitride (SiN) or plasma enhanced tetraethyl orthosilicate (PETEOS). For instance, a silicon nitride layer is formed 35 nm thick as the PMD liner layer 212.

A PMD layer 214 is formed on the PMD liner layer 212. In doing so, the PMD layer 214 is formed one of BPSG, phosphosilicate glass (PSG), and borosilicate glass (BSG). Preferably, the PMD layer 214 is formed of a BPSG layer.

The BPSG layer is formed by chemical vapor deposition (CVD) such as plasma enhanced CVD (PECVD), atmospheric pressure CVD (APCVD), sub-atmospheric CVD (SACVD), and low-pressure CVD (LPCVD), in which $SiH_4$ or TEOS can be used as a precursor. Considering boron (B) and phosphor (P) within the BPSG layer for the gap-fill capability and the gathering capability of mobile ions, the concentration of boron and phosphor is preferably set to about 1 to about 10 wt %.

A PSG layer can be formed by PECVD, APCVD, or high density plasma (HDP) CVD. For instance, HDP CVD is carried out in a following manner. First of all, after $SiH_4$, $PH_3$, oxygen, and Ar have been introduced into a reaction chamber, a high density plasma bias is applied to a substrate by maintaining a temperature of about 400 to about 650° C. and a pressure of about 1 to about 10 m Torr within the reaction chamber.

Voids (not shown in the drawing) formed within the PMD layer 214 interrupt densification of the PMD layer 214. And, the voids, which will be filled up with a conductor material forming a contact plug or the like, will cause failure of the device. To overcome the problems, thermal treatment is carried out on the PMD layer to densify. For instance, the thermal treatment is carried out by rapid thermal processing (RTP) during about 20 to about 60 seconds at about 700 to about 1,100° C. or by annealing during about 20 to about 60 minutes at about 700 to about 1,100° C. using a furnace.

Subsequently, the PMD layer 214 can be planarized by chemical mechanical polishing (CMP). Optionally, the oxide layer 216 can be further formed on the PMD layer 214. Preferably, the oxide layer 216 uses a PETEOS layer formed about 200 nm thick.

Referring to FIG. 2B, photoresist is coated on the oxide layer 216. Exposure and development are carried out on the photoresist to form a photoresist pattern (not shown in the drawing) exposing at least one portion of the oxide layer 216 to define at least one contact hole.

The oxide layer 216 and the PMD layer 214 are then etched using the photoresist pattern as an etch mask to form a contact hole 220. In case that the PMD liner layer 212 is formed of oxide, an exposed portion of the PMD liner layer 212 is removed in forming the contact hole 220. Yet, in case that the PMD liner layer 212 is formed of silicon nitride (SiN), the PMD layer 214 is etched but the PMD liner layer 212 of SiN remains. This is attributed to an etch selectivity difference.

Referring to FIG. 2C, wet cleaning is carried out on the semiconductor substrate to remove the polymer and photoresist generated from forming the contact hole 220 using an SH cleaning solution. The SH solution is a mixed solution of $H_2SO_4$ and $H_2O_2$. The wet cleaning is carried out at about 130° C. In doing so, the PMD liner layer 212 of SiN is removed as well.

Subsequently, wet cleaning is carried out using the NC-2 cleaning solution. In doing so, a temperature of the NC-2 cleaning solution is set equal to or lower than about 55° C. so that the overetch of the PMD layer 214 can be prevented. In a manner of varying the temperature of the NC-2 cleaning solution and a concentration of the NC-2 cleaning solution simultaneously, it is possible to concretely prevent the PMD layer 214 from being overetched. Namely, the overetch of the PMD layer 214 can be prevented in a manner of adjusting the concentration of the NC-2 cleaning solution while maintaining the NC-2 cleaning solution at the related art temperature of about 75° C. The NC-2 cleaning solution includes trimethyloxyethyl ammoniumhydroxide (TMH), $H_2O_2$, and $H_2O$. For instance, its volume ratio is set as $TMH:H_2O_2:H_2O=1:2.3 \sim 10:30 \sim 40$, whereby the overetch of the PMD layer 214 can be prevented.

Figure 3:
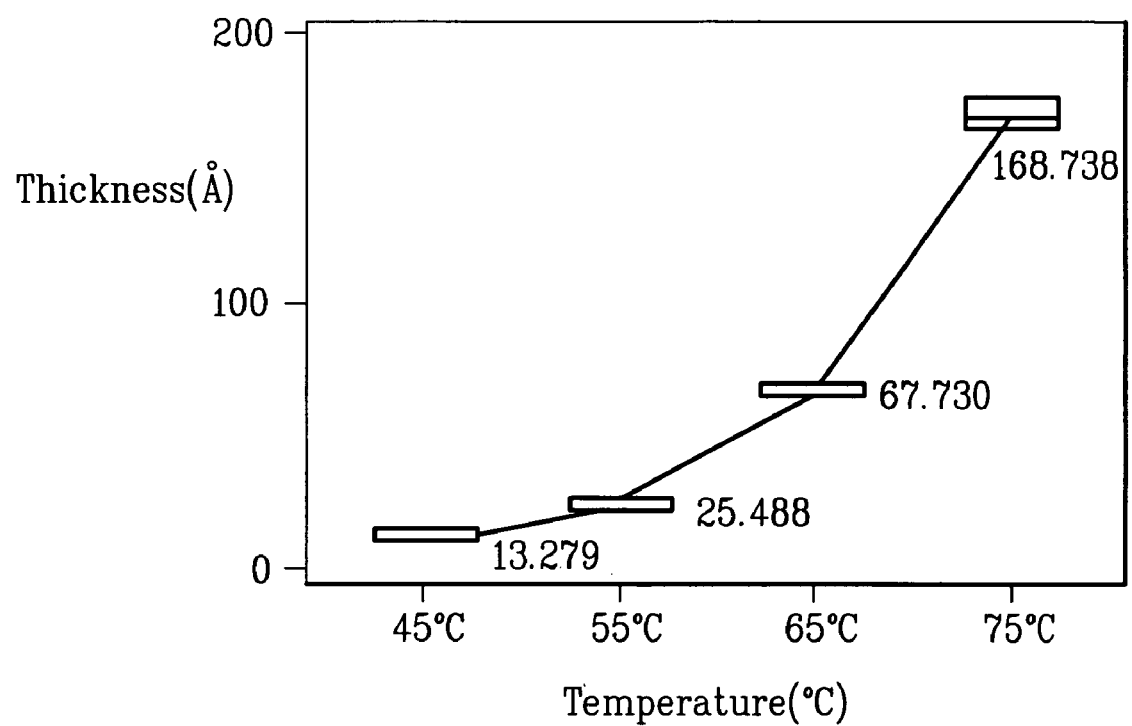
FIG. 3 is a graph of a temperature of the NC-2 cleaning solution and an etch rate of a BPSG layer.

FIG. 3 is a graph of a temperature of the NC-2 cleaning solution and an etch rate (etched thickness) of a BPSG layer.

Referring to FIG. 3, the higher the temperature rises, the more the BPSG layer is etched. This is represented in the form of a secondary function. In case that the temperature of the NC-2 cleaning solution is lowered to about 55° C. from about 75° C., the etch rate of the BPSG layer is reduced to 1/7. Besides, the same result is applicable to the case that the BPSG layer is replaced by the PSG or BSG layer as the PMD layer.

Figure 4A:
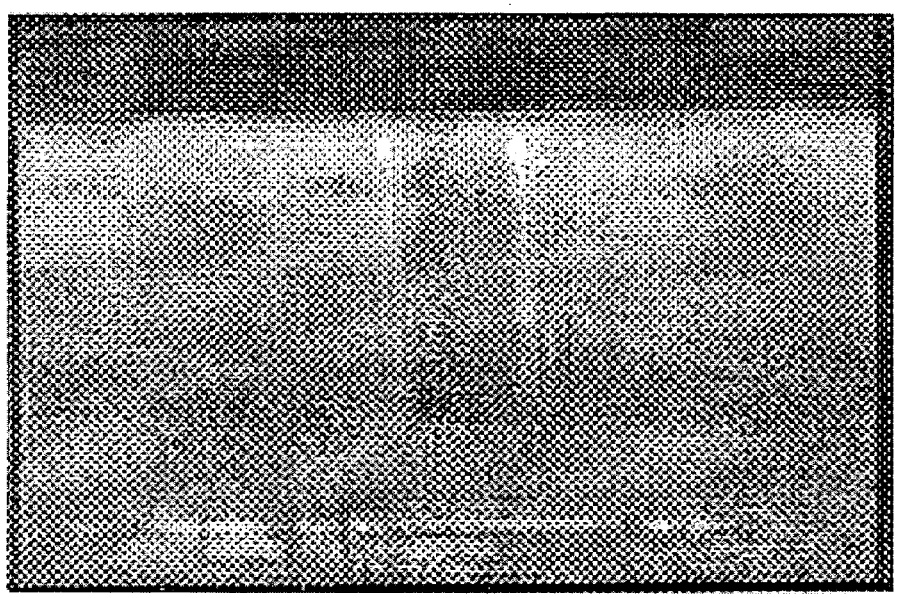
FIGS. 4A to 4C are cross-sectional SEM photographs of contact holes according to temperatures of the NC-2 solution, respectively.
Figure 4B:
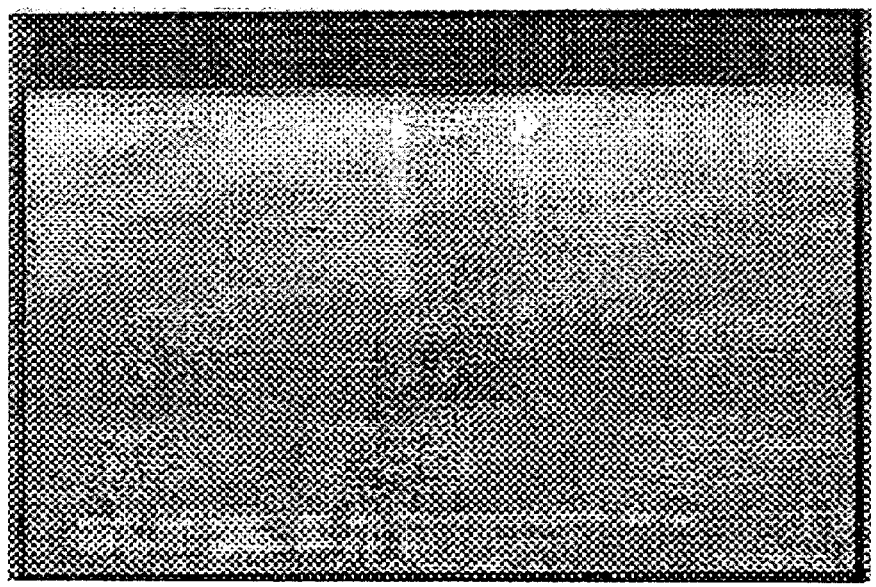
Figure 4C:
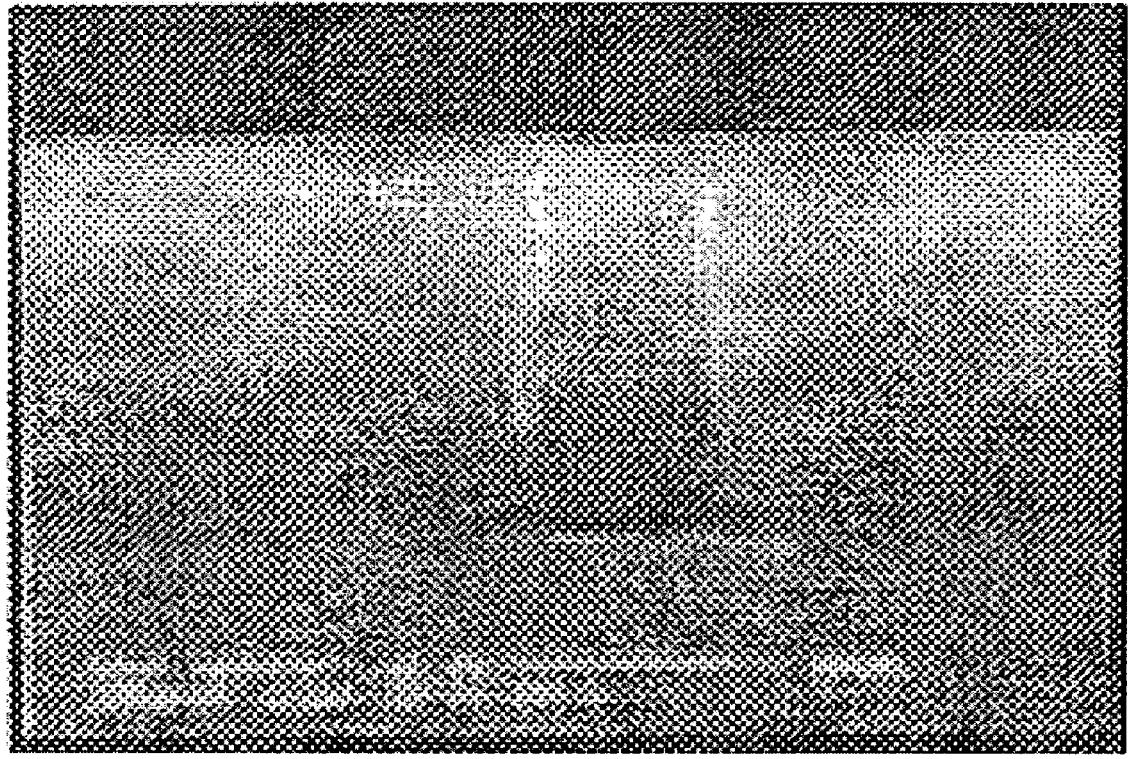

FIGS. 4A to 4C are cross-sectional scanning electron microscope (SEM) photographs of contact holes according to temperatures of the NC-2 solution, respectively, in which the temperatures of the NC-2 cleaning solution are set to 25° C., 55° C., and 75° C., respectively.

Referring to FIGS. 4A to 4C, in case of performing wet cleaning using the NC-2 cleaning solution at the related art temperature of 75° C., the PMD layer is considerably overetched. Yet, in case of performing wet cleaning using the NC-2 cleaning solution at the temperature of 55° C. or 25° C., the PMD layer avoids being overetched.

As explained in the above description, the wet cleaning is carried out after completion of etching the PMD layer in forming the contact hole to prevent the overetch of the BPSG layer. Hence, it is able to prevent the device characteristic degradation. And, the short-circuit failure caused by the metal material of the contact plug is prevented to avoid yield reduction.

Accordingly, the present invention enables the PMD layer to be protected from being overetched in a manner of adjusting the temperature and concentration of the NC-2 cleaning solution, thereby preventing the semiconductor device failure.

Therefore, the present invention raises the product yield and enhances the electrical characteristics and reliability of the semiconductor device.

Korean Application No. P2003-0069511 filed on Sep. 1, 2004, is hereby incorporated by reference in its entirety.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. A method of forming a contact hole, comprising the steps of:
    forming a premetal dielectric layer on a semiconductor substrate;
    forming a contact hole perforating the premetal dielectric layer; and
    cleaning the substrate using an NC-2 cleaning solution at a temperature equal to or lower than about 55° C.

2. The method of claim 1, further comprising the step of forming a premetal dielectric liner layer beneath the premetal dielectric layer.

3. The method of claim 2, wherein the premetal liner layer is formed of PETEOS.

4. The method of claim 2, wherein the premetal liner layer is formed of SiN.

5. The method of claim 1, further comprising the step of forming a PETEOS layer on the premetal dielectric layer.

6. The method of claim 1, further comprising the step of cleaning the substrate using an SH cleaning solution prior to the NC-2 cleaning solution cleaning step.

7. The method of claim 1, wherein the premetal dielectric layer is selected from the group consisting of BPSG, BSG, and PSG layers.

8. The method of claim 1, wherein a volume ratio of the NC-2 cleaning solution is set as $TMH:H_2O_2:H_2O=1:2.3\sim10:30\sim40$.

9. The method of claim 1, wherein a semiconductor device including a gate electrode and source/drain is formed on the semiconductor substrate.

10. A method for forming a contact hole, comprising:
    step for forming a premetal dielectric layer on a semiconductor substrate;
    step for forming a contact hole perforating the premetal dielectric layer; and
    step for cleaning the substrate using an NC-2 cleaning solution at a temperature equal to or lower than about 55° C.

11. The method of claim 10, further comprising step for forming a premetal dielectric liner layer beneath the premetal dielectric layer.

12. The method of claim 11, wherein the premetal liner layer is formed of PETEOS.

13. The method of claim 11, wherein the premetal liner layer is formed of SiN.

14. The method of claim 10, further comprising step for forming a PETEOS layer on the premetal dielectric layer.

15. The method of claim 10, further comprising step for cleaning the substrate using an SH cleaning solution prior to the step for cleaning the substrate using an NC-2 cleaning solution.

16. The method of claim 10, wherein the premetal dielectric layer is selected from the group consisting of BPSG, BSG, and PSG layers.

17. The method of claim 10, wherein a volume ratio of the NC-2 cleaning solution is set as $TMH:H_2O_2:H_2O=1:2.3\sim10:30\sim40$.

18. The method of claim 10, wherein a semiconductor device including a gate electrode and source/drain is formed on the semiconductor substrate.

* * * * *